(12) United States Patent
Baringhaus et al.

(10) Patent No.: US 12,439,635 B2
(45) Date of Patent: Oct. 7, 2025

(54) VERTICAL FIELD EFFECT TRANSISTOR AND METHOD FOR THE FORMATION THEREOF

(71) Applicant: Robert Bosch GmbH, Stuttgart (DE)

(72) Inventors: Jens Baringhaus, Sindelfingen (DE); Daniel Krebs, Aufhausen (DE); Dick Scholten, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 585 days.

(21) Appl. No.: 17/767,282

(22) PCT Filed: Sep. 24, 2020

(86) PCT No.: PCT/EP2020/076738
§ 371 (c)(1),
(2) Date: Apr. 7, 2022

(87) PCT Pub. No.: WO2021/089230
PCT Pub. Date: May 14, 2021

(65) Prior Publication Data
US 2022/0367713 A1  Nov. 17, 2022

(30) Foreign Application Priority Data
Nov. 6, 2019  (DE) .............. 10 2019 217 081.1

(51) Int. Cl.
*H10D 30/63* (2025.01)
*H10D 12/01* (2025.01)
(Continued)

(52) U.S. Cl.
CPC ......... *H10D 30/635* (2025.01); *H10D 12/031* (2025.01); *H10D 30/021* (2025.01);
(Continued)

(58) Field of Classification Search
CPC ........... H01L 29/7828; H01L 29/66666; H01L 29/0657; H10D 30/635; H10D 62/151; H10D 62/117
See application file for complete search history.

(56) References Cited

U.S. PATENT DOCUMENTS

| 9,281,379 B1 | 3/2016 | Campi, Jr. et al. |
| 2007/0082448 A1 | 4/2007 | Kim et al. |

(Continued)

FOREIGN PATENT DOCUMENTS

| CN | 110299412 A | 10/2019 |
| DE | 102014117558 A1 | 6/2016 |

(Continued)

OTHER PUBLICATIONS

International Search Report for PCT/EP2020/076738, Issued Dec. 1, 2020.

*Primary Examiner* — Shih Tsun A Chou
(74) *Attorney, Agent, or Firm* — NORTON ROSE FULBRIGHT US LLP

(57) ABSTRACT

A vertical field effect transistor. The vertical field effect transistor includes: a drift area; a semiconductor fin on or above the drift area; a connection area on or above the semiconductor fin; and a gate electrode, which is formed adjacent to at least one side wall of the semiconductor fin, the semiconductor fin, in a first section, which is situated laterally adjacent to the gate electrode, having a lesser lateral extension than in a second section, which contacts the drift area, and/or than in a third section, which contacts the connection area.

10 Claims, 5 Drawing Sheets

(51) Int. Cl.
  *H10D 30/01*   (2025.01)
  *H10D 62/10*   (2025.01)
  *H10D 62/832*  (2025.01)
  *H10D 62/85*   (2025.01)

(52) U.S. Cl.
  CPC ......... *H10D 30/025* (2025.01); *H10D 62/109* (2025.01); *H10D 62/8325* (2025.01); *H10D 62/8503* (2025.01)

(56) References Cited

U.S. PATENT DOCUMENTS

| | | | |
|---|---|---|---|
| 2012/0161208 A1* | 6/2012 | Veliadis | H01L 29/2003 |
| | | | 257/E21.445 |
| 2013/0043468 A1 | 2/2013 | Adekore | |
| 2014/0291616 A1 | 10/2014 | Park et al. | |
| 2016/0293751 A1* | 10/2016 | Siemieniec | H01L 29/8613 |
| 2019/0296142 A1 | 9/2019 | Ebrish et al. | |

FOREIGN PATENT DOCUMENTS

| | | | |
|---|---|---|---|
| GB | 2572442 A | 10/2019 | |
| JP | H04309269 A | 10/1992 | |
| JP | 2000228528 A | 8/2000 | |
| JP | 2001102576 A | 4/2001 | |
| JP | 2008270310 A | 11/2008 | |
| JP | 2010232627 A | 10/2010 | |
| JP | 2013012647 A | 1/2013 | |
| JP | 2013219161 A | 10/2013 | |
| JP | 201482341 A | 5/2014 | |
| KR | 20050099330 A | 10/2005 | |
| WO | 2014141472 A1 | 9/2014 | |
| WO | 2018147466 A1 | 8/2018 | |

\* cited by examiner

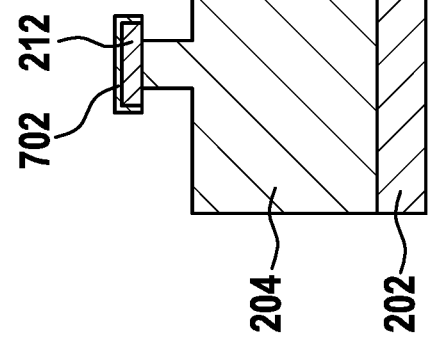
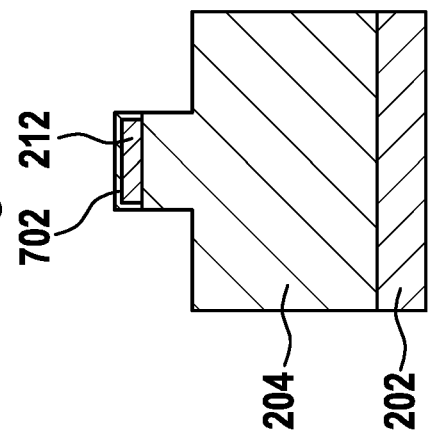
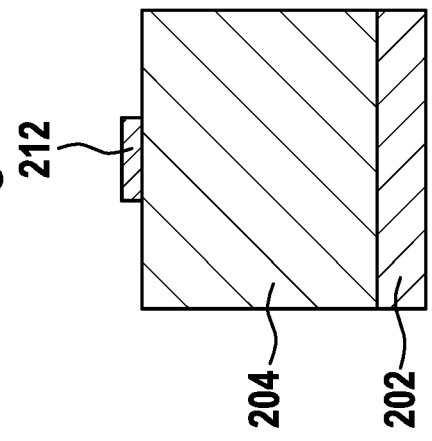
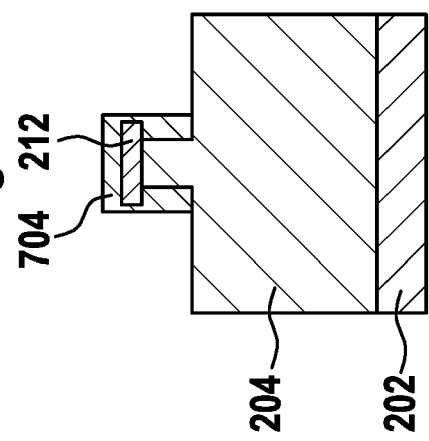
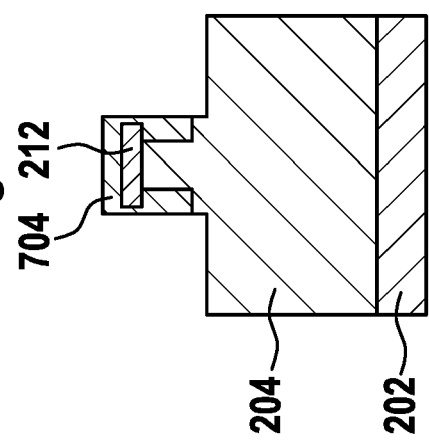
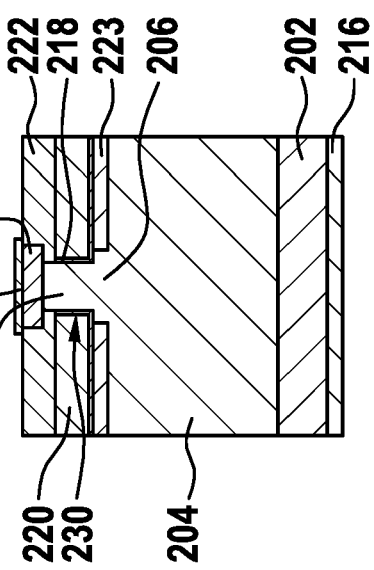

230

240

230

VERTICAL FIELD EFFECT TRANSISTOR AND METHOD FOR THE FORMATION THEREOF

FIELD

The present invention relates to a vertical field effect transistor and a method for the formation thereof.

BACKGROUND INFORMATION

In the automotive field, approaches for power semiconductors that switch rapidly and without loss are in demand with the progressing development toward electromobility. The simultaneous trend from lateral to vertical components and the trend of silicon technology, which has been established for decades, toward so-called "wide band gap" materials, i.e., semiconductor materials including a wide band gap, for example silicon carbide (SiC) or gallium nitride (GaN), has resulted here in the development of novel component concepts and manufacturing processes.

For the application of semiconductors including a wide band gap, the use of so-called power FinFETs (Fin=fin, FET=field effect transistor) may be advantageous. In conventional MOSFETs or MISFETs, the actively switchable component is provided by an inversion channel—for example, by the p-region in an npn-transition, in which an electron path is formed by applying a gate voltage. In a power FinFET, in contrast, the switchable component is made up of a narrow semiconductor fin, which is switchable due to its geometry and matching selection of the gate metallization. The channel resistance of the power FinFET is significantly less than in a conventional MOSFET or MISFET based on SiC or GaN. A lower on-resistance of the entire component results therefrom.

In the power FinFET, the channel area is formed in the area of the semiconductor fin at the height of the gate metal. Since the width of this area substantially determines the threshold voltage of the power FinFET, this area is not to reach a certain value in its width in order to ensure complete depletion. The structure of a power FinFET 100 of the related art is illustrated in FIG. 1. Conventional power FinFET 100 includes, on a substrate 102, a drift area 104 including an n doping, a drain electrode 106, a source electrode 108, a gate electrode 110, a semiconductor fin 112, a gate dielectric 114, and an insulation 116. Semiconductor fin 112 is connected to source electrode 108 with the aid of an n+ doping 118. In power FinFET 100, the switchable component is made up of narrow semiconductor fin 112, which is switchable due to its geometry and matching selection of gate metallization 110. The width of the semiconductor fin is dependent in particular on the semiconductor material used in the semiconductor fin and the work function of the gate metal. Such narrow semiconductor fins may no longer be able to be manufactured using conventional photolithography, as is typically used in the mass production of power transistors. Moreover, thin semiconductor fins make the electrical contact more difficult with a front side metallization including low electrical resistance.

SUMMARY

One object of the present invention is to provide a vertical field effect transistor and a method for the formation thereof, which enables a vertical field effect transistor including an improved front side contact.

The object may be achieved according to one aspect of the present invention by a vertical field effect transistor. In accordance with an example embodiment of the present invention, the vertical field effect transistor includes: a drift area, a semiconductor fin on or above the drift area, a connection area on or above the semiconductor fin, and a gate electrode which is formed adjacent to at least one side wall of the semiconductor fin, the semiconductor fin having a smaller lateral extension in a first section, which is situated laterally adjacent to the gate electrode, than in a second section, which contacts the drift area, and/or than in a third section, which contacts the connection area. The wider areas above and/or below the channel region (first section) enable a larger contact surface on the semiconductor fin and thus a reduction of the parasitic electrical contact resistance of the contact areas of the semiconductor fin (second and/or third section of the semiconductor fin). A widened semiconductor fin in the area above and/or below the channel region enables a reduction of the contact resistance of the front side contact, for example, the source electrode.

Alternatively to a semiconductor fin, in a further aspect a semiconductor column may be formed.

The object may also be achieved according to a further aspect of the present invention by a method for forming a vertical field effect transistor. In accordance with an example embodiment of the present invention, the method includes: forming a drift area, forming a semiconductor fin on or above the drift area, forming a connection area on or above the semiconductor fin, and forming a gate electrode, which is formed laterally adjacent to at least one side wall of the semiconductor fin, the semiconductor fin, in a first section, which is situated laterally adjacent to the gate electrode, being formed having a lesser lateral extension than in a second section, which contacts the drift area, and/or than in a third section, which contacts the connection area. This enables more cost-effective facility equipment to be used to manufacture the vertical field effect transistors, with respect to investment and operating costs, in comparison to other concepts.

Refinements of the aspects of the present invention are represented in the description. Specific embodiments of the present invention are illustrated in the figures and explained in greater detail hereinafter.

BRIEF DESCRIPTION OF THE DRAWINGS

FIGS. 7A through 7F each show a schematic representation of a method step for manufacturing a vertical field effect transistor according to various specific embodiments of the present invention.

DETAILED DESCRIPTION OF EXAMPLE EMBODIMENT

Figure 1:
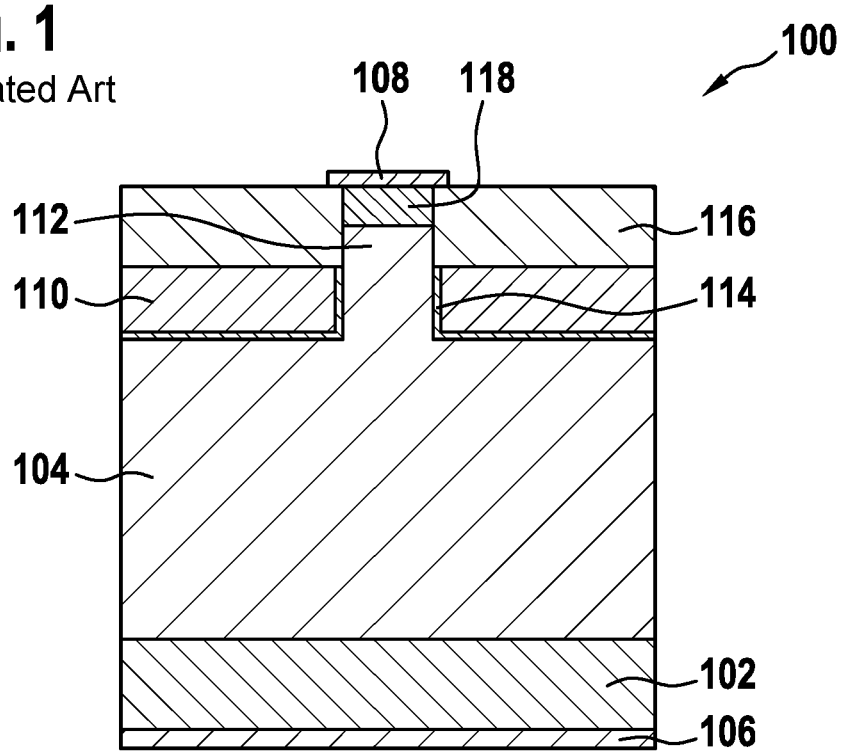
FIG. 1 shows a schematic representation of a vertical field effect transistor of the related art.

In the following detailed description, reference is made to the figures, which form a part of this description and in which specific exemplary embodiments are shown for illustration, in which the present invention may be implemented. It is obvious that other exemplary embodiments may be used and structural or logical modifications may be carried out without departing from the scope of protection of the present invention. The features of the various exemplary embodiments described herein may be combined with one another if not specifically indicated otherwise. The following detailed description is therefore not to be interpreted restrictively. In the figures, identical or similar elements are provided with identical reference numerals, if appropriate.

Figure 2:
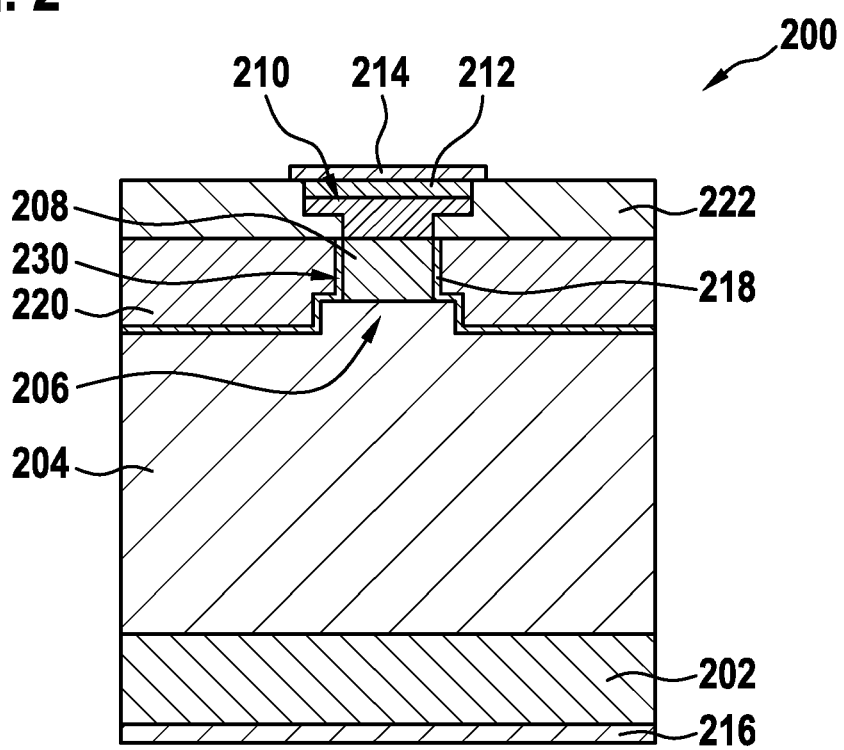
FIGS. 2 through 6 show schematic sectional representations of a vertical field effect transistor according to various specific embodiments of the present invention.

FIG. 2 shows a schematic sectional representation of a vertical field effect transistor 200 according to various specific embodiments. In various specific embodiments, vertical field effect transistor 200 includes a drift area 204 on a semiconductor substrate 202, a semiconductor fin 230 (the longitudinal direction of which extends perpendicularly to the plane of the drawing) including a connection area 212 on or above drift area 204, a first source/drain electrode (for example, a source electrode 214), and a second source/drain electrode (for example, a drain electrode 216). It is assumed by way of example hereinafter that the first source/drain electrode is a source electrode 214 and the second source/drain electrode is a drain electrode 216. Vertical field effect transistor 200 furthermore includes a gate electrode 220 laterally adjacent to at least one side wall of semiconductor fin 230, gate electrode 220 being electrically insulated with the aid of an insulation layer 222 from source electrode 214. A gate dielectric 218 is situated between gate electrode 220 and at least one side wall of semiconductor fin 230.

Semiconductor fin 230 is formed in such a way that in a first section 208, which is situated laterally adjacent to gate electrode 220, it has a lesser lateral extension than in a second section 206, which contacts drift area 204, and/or than in a third section 210, with the aid of which source electrode 214 is contacted. This enables current-conducting contact surfaces on the substrate front side to be enlarged by a multiple. A significantly lower and more reliable ohmic contact area may thus be manufactured for the vertical field effect transistor.

In other words: Semiconductor fin 230 is laterally widened in second section 206 and/or third section 210 with respect to first section 208 and thus has a reduced total resistance. The widenings in second section 206 and third section 210 may be formed having both equal and different lateral extension in relation to one another. In various specific embodiments, semiconductor fin 230 has a greater lateral extension in second section 206 but not in third section 210 than in first section 208 (see FIG. 3). Alternatively, semiconductor fin 230 has a greater lateral extension in third section 210 but not in second section 206 than in first section 208. Alternatively, semiconductor fin 230 has a greater lateral extension in second and third sections 206, 210 than in first section 208. Semiconductor fin 230 may include at least one essentially linear or straight or vertical planar side wall. Semiconductor fin 230 includes, for example, a linear first side wall and a linear second side wall which is opposite the first side wall. The first and second side wall may be parallel to one another.

FIG. 2 shows a schematic sectional view through a single FinFET cell according to various specific embodiments. In general, several hundred to several thousand such cells are connected in parallel, and the structure continues into the plane in the third dimension. A two-dimensional extended field of FinFET cells results by combination of multiple cells. The vertical field effect transistor may be a power semiconductor device. As an example: semiconductor substrate 202 may be a GaN substrate 202 or a SiC substrate 202. A weakly n-conductive semiconductor drift area 204 may be formed (for example applied) on semiconductor substrate 202, for example, a GaN drift area 204 or a SiC drift area 204. Above drift area 204, an n-conductive semiconductor region in the form of semiconductor fin 230 may be formed, for example, in the form of a GaN or SiC fin. Connection area 212 may include an n doped (for example, n+ doped) semiconductor material or may be formed therefrom.

For the function of vertical field effect transistor 200 as a transistor or switch, semiconductor fin 230 includes in first section 208, for example, a lateral extension in the illustrated plane of the drawing in the range of approximately 100 nm to approximately 200 nm and a vertical extension in the illustrated plane of the drawing in the range of approximately 0.3 µm to approximately 3 µm.

Without application of a gate voltage, field effect transistor 200 may be self-blocking, since the electron gas below semiconductor fin 230 may be depleted in drift area 204. By applying a positive voltage at gate electrode 220, electrons may be accumulated in the area of semiconductor fin 230 which is adjacent to gate electrode 220. The electrons may flow from source electrode 214 through semiconductor fin 230 into the base of semiconductor fin 230 and from there into drift area 204 and move further through drift area 204 and substrate 202 into drain electrode 216.

In various specific embodiments, connection area 212 is formed in the entire depth (in the plane of the drawing) over third section 210.

In various specific embodiments, gate dielectric 218, drift area 204, and/or semiconductor fin 230 may be formed in such a way that the interface to gate dielectric 218 includes rounded corners and/or edges or has the largest possible radius of curvature. This enables field peaks to be reduced.

Figure 3:
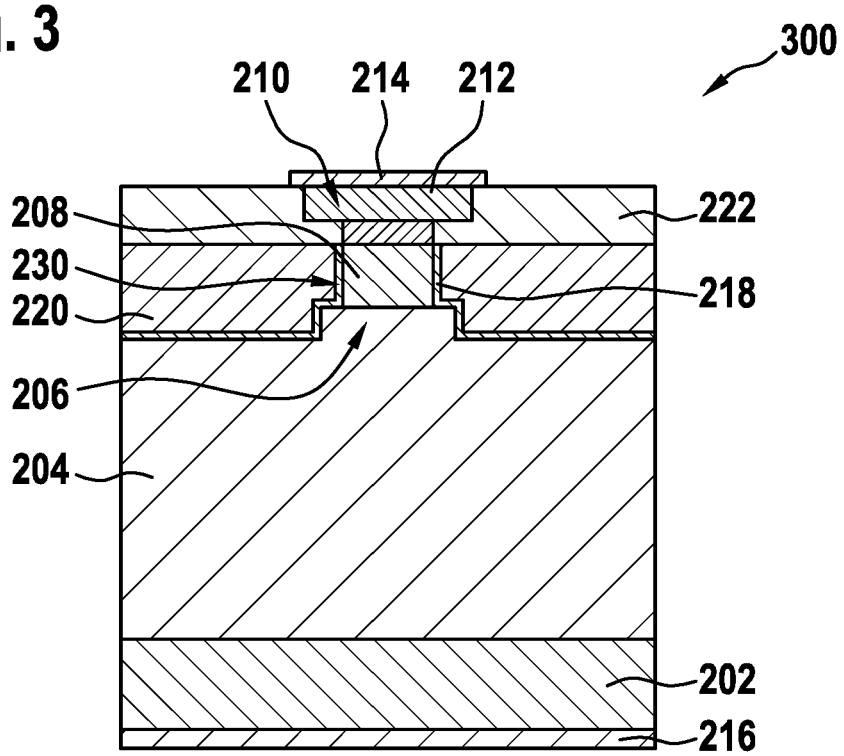

In various specific embodiments, connection area 212 has a lateral extension which is greater than the lateral extension of semiconductor fin 230 in third section 210, as illustrated in FIG. 3, which shows a vertical field effect transistor 300 according to various specific embodiments.

Figure 4:
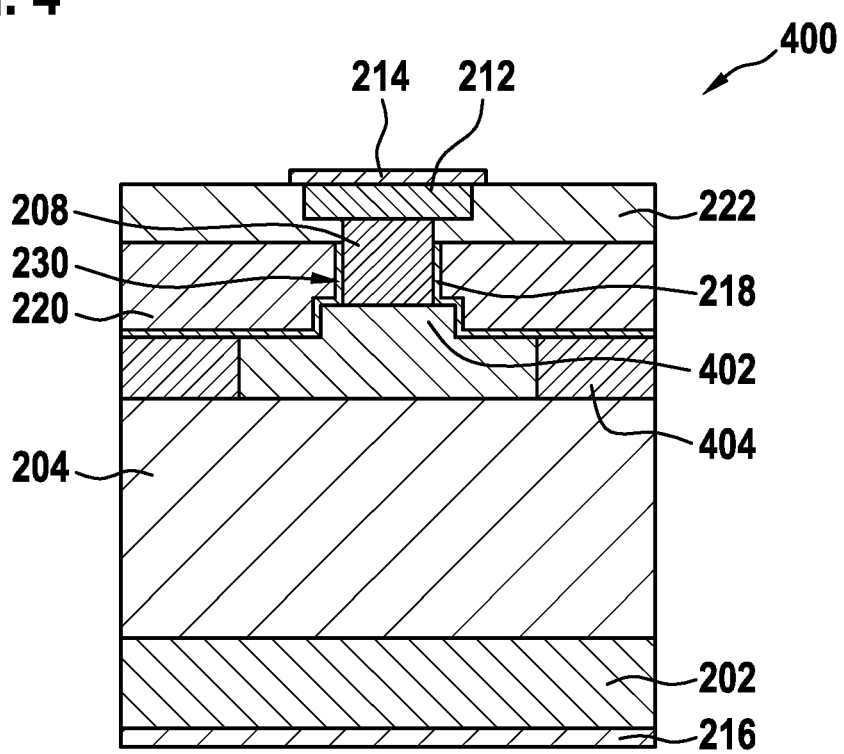

Semiconductor fin 230 may include a connection area 402 in second section 206, which has a greater conductivity than semiconductor fin 230 in first section 208 and/or than drift area 204, as illustrated in FIG. 4, which shows a vertical field effect transistor 400 according to various specific embodiments.

In various specific embodiments, a shielding structure 404 may be provided, which is formed laterally adjacent to connection area 402, shielding structure 404 including a different conductivity type than connection area 402, as illustrated in FIG. 4. Connection area 402 in the second section may include an n doped (for example, n+ doped) semiconductor material or may be formed therefrom. Shielding structure 404 includes, for example, p doped or intrinsic semiconductor material or is formed therefrom.

Figure 5:
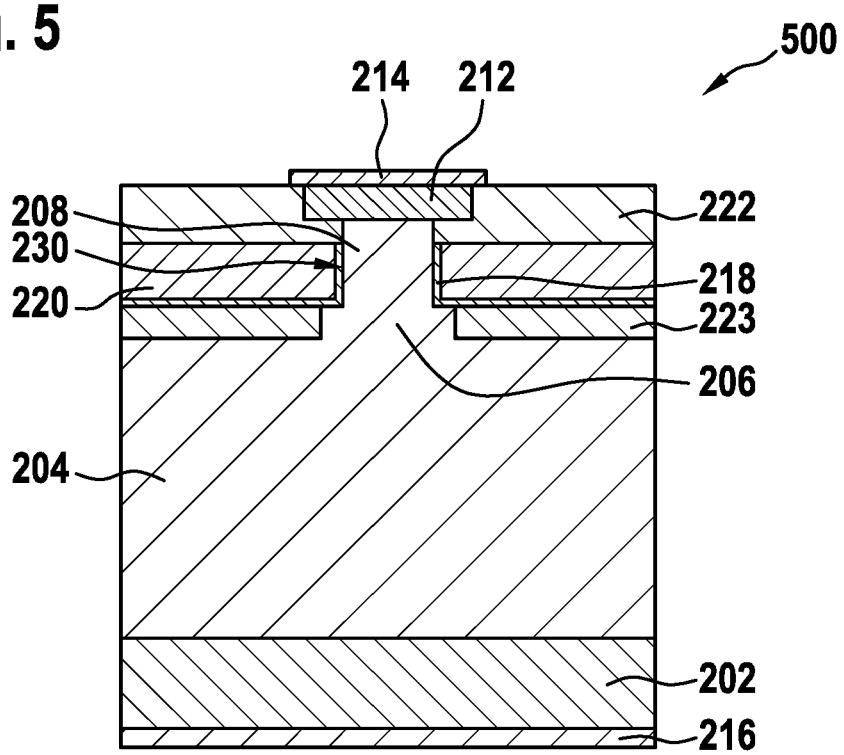

Semiconductor fin 230 may be n doped more intensely in second section 206 than in first section 208. This enables better current inclination. Furthermore, a shielding structure 404 may be provided, which is situated below gate electrode 220 in drift area 204. This enables gate dielectric 218 to be shielded against field peaks. In second section 206, semiconductor fin 230 may include increased n doping. Alternatively, the increased n doping may be formed up to the lower edge of shielding structure 404. Shielding structure 404 including the p doping may be electrically conductively connected to source electrode 214. Alternatively or additionally, electrical field peaks, which occur vertically at gate dielectric 218 between gate electrode 220 and drift area 204, may be reduced with the aid of a second insulation layer 223, which is situated in the base between drift area 204 and gate electrode 220 adjacent to semiconductor fin 230, as illustrated in FIG. 5, which shows a vertical field effect transistor 500 according to various specific embodiments. For example, second insulation layer 223 may be situated between gate dielectric 218 and drift area 204. This enables the breakdown resistance of gate dielectric 218 in this area to be increased and thus the electric strength of the vertical field effect transistor to be increased. Second insulation layer 223 may have a greater thickness than gate dielectric 218.

Figure 6:
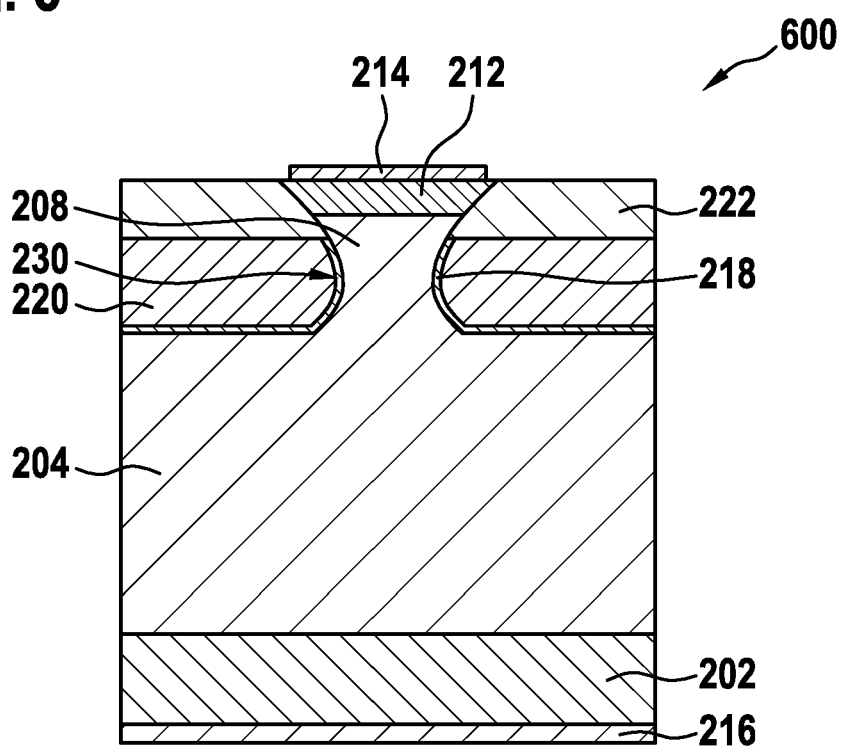

In various specific embodiments, at least one side wall of semiconductor fin 230 may be curved or bent, as shown in FIG. 6, which shows a vertical field effect transistor 600 according to various specific embodiments.

Figure 8A:
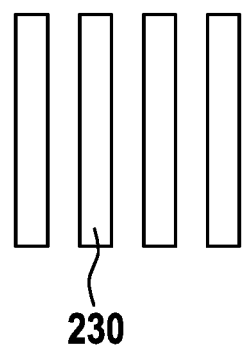
FIGS. 8A through 8C each show a schematic top view of a semiconductor fin, a semiconductor column, or a network made up of connected semiconductor fins according to various specific embodiments of the present invention.
Figure 8B:
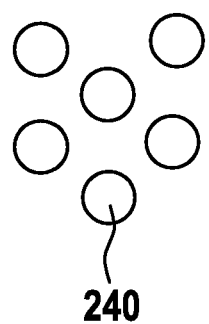
Figure 8C:
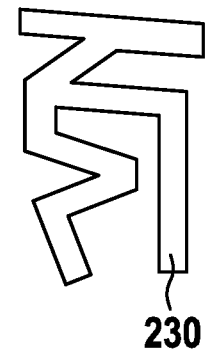

A plurality of semiconductor fins 230 may be situated adjacent to one another (FIG. 8A). Alternatively to a semiconductor fin, one or multiple semiconductor columns 240 (see FIG. 8B) may be provided. Alternatively, a network made up of two or more semiconductor fins 230 connected to one another may be provided (see FIG. 8C).

Figure 9:
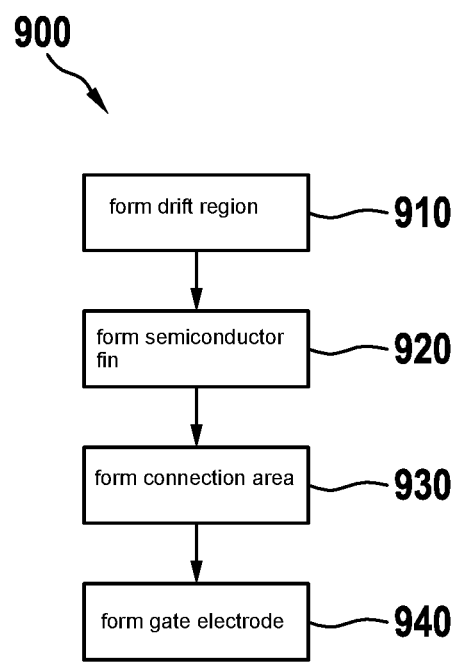
FIG. 9 shows a flowchart of a method for forming a vertical field effect transistor according to various specific embodiments of the present invention.

FIG. 9 illustrates a flowchart of a method 900 for forming a vertical field effect transistor according to various specific embodiments. Method 900 includes: forming 910 a drift area; forming 920 a semiconductor fin on or above the drift area, and forming 930 a connection area on or above the semiconductor fin, and forming 940 a gate electrode, which is formed adjacent to at least one side wall of the semiconductor fin. The semiconductor fin is formed in a first section, which is situated laterally adjacent to the gate electrode, having a lesser lateral extension than in a second section, which contacts the drift area, and/or than in a third section, which contacts the connection area. The lesser lateral extension of the semiconductor fin may be formed, for example, using an etch stop mask and anisotropic etching. The etch stop mask may be formed on or above the semiconductor fin.

In semiconductor materials on which no thermal oxide may be formed, for example, gallium nitride (GaN), gallium oxide (GaOx), aluminum nitride (AlN), or diamond, an anisotropic etching process may offer the option of implementing the shape of semiconductor fins 230 shown in FIG. 2. In FIGS. 7A through 7F, schematic sectional representations of an example of a method for forming a vertical field effect transistor based on GaN are illustrated.

FIG. 7A shows the provision of an n+ doped semiconductor material 212, which is provided with the aid of epitaxy or (ion) implantation on or above a drift area 204 and a substrate 202. A flat semiconductor fin is formed in the n+ doped semiconductor material, by which connection area 212 is structured. The structuring may be formed with the aid of wet chemical etching or dry etching. For gallium nitride, gallium oxide, and aluminum nitride, for example, dry etching in a chlorine-containing plasma may be applied. For diamond, comparable etching in an oxygen-containing plasma may be applied. Wet chemical etching processes for gallium nitride are possible, for example, in potassium hydroxide (KOH) or tetramethyl ammonium hydroxide (TMAH) of various concentrations and temperatures.

FIG. 7B shows masking or forming of a mask 702 on or above connection area 212 and structuring or forming a trench structure (trench) to expose or form the semiconductor fin. Nitride and/or oxide compounds may be used as masking materials.

FIG. 7C shows anisotropic wet etching, for example, with the aid of KOH or TMAH, to form the first section of the semiconductor fin.

FIG. 7D shows a further masking or forming of a mask 704 on or above the semiconductor fin.

FIG. 7E shows forming a further trench structure around the masked semiconductor fin to form the widening of semiconductor fin 230 or the second section of the semiconductor fin.

FIG. 7F shows forming the gate, source and drain electrodes as well as the insulations.

The specific embodiments described and shown in the figures are only selected as examples. Different specific embodiments may be combined with one another completely or with respect to individual features. One specific embodiment may also be supplemented by features of another specific embodiment. Furthermore, described method steps may be carried out repeatedly and in an order other than that described. In particular, the present invention is not restricted to the specified method.

What is claimed is:

1. A vertical field effect transistor, comprising:
a drift area;
a semiconductor structure on or above the drift area;
a connection area on or above the semiconductor structure; and
a gate electrode, which is formed adjacent to at least one side wall of the semiconductor structure; and
a shielding structure, which is formed laterally adjacent to the connection area,
wherein the semiconductor structure has a lateral extension in a first section situated laterally adjacent to the gate electrode, in a second section contacting the drift area, and in a third section contacting the connection area, the lateral extension in the first section is less than the lateral extension in the second section, and/or less than the lateral extension in the first section.

2. The vertical field effect transistor as recited in claim 1, furthermore including an insulation layer, which is situated between the gate electrode and the drift area.

3. The vertical field effect transistor as recited in claim 1, wherein the semiconductor structure is a semiconductor fin.

4. The vertical field effect transistor as recited in claim 3, wherein the semiconductor fin includes at least one linear side wall.

5. The vertical field effect transistor as recited in claim 3, wherein the semiconductor fin includes a linear first side wall and a linear second side wall, which is opposite the first side wall.

6. The vertical field effect transistor as recited in claim 3, wherein the connection area has a lateral extension which is greater than the lateral extension of the semiconductor fin in the third section.

7. The vertical field effect transistor as recited in claim 3, wherein the drift area and the semiconductor fin include gallium nitride or silicon carbide or are formed from gallium nitride or silicon carbide.

8. The vertical field effect transistor as recited in claim 3, wherein the semiconductor fin is formed as a network made up of two or more semiconductor fins connected to one another.

9. A vertical field effect transistor, comprising:
a drift area;
a semiconductor structure on or above the drift area;
a connection area on or above the semiconductor structure; and
a gate electrode, which is formed adjacent to at least one side wall of the semiconductor structure;
wherein the semiconductor structure has a lateral extension in a first section situated laterally adjacent to the gate electrode, in a second section contacting the drift area, and in a third section contacting the connection area, the lateral extension in the first section is less than the lateral extension in the second section, and/or less than the lateral extension in the first section, wherein the semiconductor structure is a semiconductor fin, wherein the semiconductor fin includes a connection area in the second section, which has a greater conductivity than the semiconductor fin in the first section and/or than the drift area.

10. The vertical field effect transistor as recited in claim 9, wherein the shielding structure includes a different conductivity type than the connection area in the second section.

* * * * *